United States Patent
Achir

(10) Patent No.: US 9,483,345 B2
(45) Date of Patent: Nov. 1, 2016

(54) DATA PROCESSING METHOD AND APPARATUS FOR PROCESSING A PLURALITY OF RECEIVED COPIES OF THE SAME ORIGINAL DATA

(71) Applicant: CANON KABUSHIKI KAISHA, Tokyo (JP)

(72) Inventor: Mounir Achir, Chantepie (FR)

(73) Assignee: Canon Kabushiki Kaisha, Tokyo (JP)

( * ) Notice: Subject to any disclaimer, the term of this patent is extended or adjusted under 35 U.S.C. 154(b) by 139 days.

(21) Appl. No.: 13/955,302

(22) Filed: Jul. 31, 2013

(65) Prior Publication Data

US 2014/0040675 A1 Feb. 6, 2014

(30) Foreign Application Priority Data

Aug. 1, 2012 (GB) .................................. 1213702.2

(51) Int. Cl.
| | |
|---|---|
| G06F 11/08 | (2006.01) |
| H04L 1/06 | (2006.01) |
| H04L 1/00 | (2006.01) |
| H03M 13/09 | (2006.01) |

(52) U.S. Cl.
CPC ............ G06F 11/08 (2013.01); H04L 1/0047 (2013.01); H04L 1/0061 (2013.01); H04L 1/06 (2013.01); H03M 13/09 (2013.01)

(58) Field of Classification Search
CPC .... G06F 11/08; G06F 11/10; G06F 11/1004; H04L 1/0061; H04L 1/0045; H04L 1/0047; H03M 13/09; H03M 13/091; H04B 7/0837; H04B 7/0857; H04B 7/0874; H04B 7/0882; H04B 7/0885; H04B 7/0888
USPC .............................. 714/48, 49, 746, 799, 800
See application file for complete search history.

(56) References Cited

U.S. PATENT DOCUMENTS

| | | | |
|---|---|---|---|
| 5,553,243 A | 9/1996 | Harrison et al. | |
| 5,745,502 A | 4/1998 | Khayrallah et al. | |
| 2003/0112780 A1 | 6/2003 | Ouyang et al. | |
| 2010/0100787 A1* | 4/2010 | Zhang | H04L 1/1607 714/748 |
| 2010/0269005 A1 | 10/2010 | Budampati et al. | |
| 2011/0185248 A1* | 7/2011 | Linskey et al. | ............... 714/748 |

FOREIGN PATENT DOCUMENTS

| | | |
|---|---|---|
| FR | 2924288 A1 * | 5/2009 |
| WO | 97/37459 A1 | 10/1997 |
| WO | 2011/090680 A1 | 7/2011 |

OTHER PUBLICATIONS

Guignard et al., Machine Translation of Iterative-Decoding Method for Wireless Mesh Communication System, May 29, 2009, Canon (Machine Translation of FR2924288A1 produced on Aug. 9, 2015).*

* cited by examiner

*Primary Examiner* — Albert Decady
*Assistant Examiner* — Christian Dorman
(74) *Attorney, Agent, or Firm* — Canon U.S.A., Inc. IP Division

(57) ABSTRACT

A method for processing a plurality of received copies of the same original data, the method comprising performing maximum ratio combining on equivalent data portions of the received copies to derive at least one further equivalent data portion. The received and the constructed copies are then divided into sub-portions and combinations of divided sub-portions are assembled to provide reconstructed data portions. An error rate assessment is performed on the reconstructed data portions; and on this basis one is selected as an output.

6 Claims, 8 Drawing Sheets

DATA PROCESSING METHOD AND APPARATUS FOR PROCESSING A PLURALITY OF RECEIVED COPIES OF THE SAME ORIGINAL DATA

CROSS REFERENCE TO RELATED APPLICATIONS

This application claims the benefit under 35 U.S.C. §119 (a)-(d) of United Kingdom Patent Application No. 1213702.2, filed on Aug. 1, 2012 and entitled "Data Processing Method and Apparatus".

The above cited patent application is incorporated herein by reference in its entirety.

FIELD OF THE INVENTION

The present invention relates to the wireless transmission of data, particularly, but not exclusively uncompressed High Definition (HD) video or image data for applications requiring low Bit Error Rate (BER) and low latency transmission.

Specific embodiments of the invention relate to a 60 GHz wireless network system using one moving emitter and several fixed receivers, said receivers being connected by wire to a system controller device. The system controller device uses a decoding technique based on Cyclic Redundancy Check (CRC) to retrieve the HD video or image data.

A wireless network system using the millimeter wave frequency band (60 GHz) is well adapted to the transmission of uncompressed HD video or image data, having a large available bandwidth. This large bandwidth allows data rate transmission in excess of 3 Gbps. Another characteristic of a wireless network using 60 GHz frequency band is a sensibility to shadowing phenomenon.

Transmission tends to be line of sight (LOS) and static or moving obstacles such as furniture, objects, people etc can cut or disturb the communication path and cause transmission errors.

To mitigate transmission errors in a 60 GHz wireless system, a multi-reception technique can be used to create spatial diversity and a CRC decoding technique can assist in providing low BER and low latency which is desirable for the application.

US2010/269005 describes a method for a multi-reception wireless system. In this document, the receiver receives several copies of the same packet sent by the source and representing the original data to be retrieved, splits each received copy into multiple sub-packets and combines the sub-packets to reconstruct a packet before performing a CRC calculation. If the CRC check is positive then the reconstructed packet is presented to the upper layer of the receiver.

SUMMARY OF THE INVENTION

It is an object of certain aspects of the present invention to provide an improved multi-reception method and apparatus suitable for a wireless data transmission application, and an object of particular embodiments is, in a 60 GHz wireless network system featuring one moveable emitter sending the same data to several fixed receivers, to combine and decode different copies of data received so as to provide reduced BER and low latency.

Accordingly, in a first aspect the present invention provides A data processing method for processing a plurality (n) of received copies of the same original data, each said copy including at least one data portion, the method comprising performing maximum ratio combining on equivalent data portions of the received copies to derive at least one further equivalent data portion; dividing each of the equivalent data portions of the received data portions and the equivalent further data portion into m sub-portions; assembling combinations of divided sub-portions to provide reconstructed data portions; performing an error rate assessment on said reconstructed data portions; and selecting one of said reconstructed data portions as an output based on the result of said assessment In this way, the invention affords better BER performance than a conventional decision mechanism when receivers have different reception qualities. The combination of a concatenation approach using received copies, and a statistical reconstructed copy produced by using maximum ratio combining, provides improved BER as is explained below in relation to FIG. 8.

According to certain embodiments therefore, n+1 equivalent copies of the received data are obtained, and each of these is divided into m sub-portions, resulting in a total of m(n+1) sub-portions. These sub-portions are then assembled to provide reconstructed data portions, being reconstructed so as to preserve the order of any given sub-portion within the overall data portion. A total number of $(n+1)^m$ reconstructed data portions are therefore possible, including reconstructed portions which are derived from both received portions and the at least one further derived portion.

The sub-portions are of equal size in some embodiments, but can be of differing sizes in other embodiments. However, corresponding sub-portions in different copies should preferably be of the same size to ensure straight forward assembly and reconstruction.

Maximum ratio combining is an example of a method of diversity combining, whereby multiple received signals are combined to provide a single improved signal. In maximum ratio combining the received signals are typically weighted. Weights can be obtained according to the amplitude or SNR of each received copy for example. In a particular embodiment, all weights are made equal (ie all weights=1), and this case is sometimes referred to as majority decision or majority vote processing.

By majority decision processing, it is meant generating at least one further copy of the data packet from the plurality of copies wherein the value of each symbol of the further copy is based on the values of corresponding symbols, located at the same position in the plurality of copies, and on an information indicative of the reliability of said corresponding symbols. In a preferred embodiment, equivalent received symbols are compared and the value (typically 1 or 0) having the highest frequency is selected. Preferably the majority decision processing operates on individual data components of a size smaller than the sub-portions into which the data portions are divided, typically operating at the level of each received symbol individually.

In a particular embodiment, the reconstructed copy having a lower or equal symbol error rate than the symbol error rate of the other copies is selected.

According to some embodiments, the selecting step comprises decoding the reconstructed copies by means of an error detection code (CRC), and selecting the reconstructed copy having no errors, if any.

This provides the advantage of limiting the complexity of calculation due to the number of combinations to a minimum and ensure that the reconstructed copy is error free.

The different combined data blocks can be constructed in real time while the different copies of encoded data block are received by the system controller. Thus, in embodiments, the CRC check modules can be parallelized and started simultaneously for all combined data blocks before copies of encoded data block are completely received. This has the advantage of reducing the decoding latency.

The invention is not limited to the use of a CRC coding. Other coding techniques could be used, in this case it is checked that the resulting combination is a codeword.

In a further embodiment, the method further comprises dividing each of the equivalent data portions of the received data portions and the equivalent further data portions into more than m sub portions, and assembling combinations of said more than m sub portions to provide reconstructed data portions.

In this way, an iterative method can be employed, whereby data portions are divided into sub-portions of an initial size, and combinations then assembled and assessed for output selection. If for example no combination satisfies an assessment criterion, then the method can return to divide the data portions into sub-portions of a smaller size (or equivalently a greater number of sub portions) and combinations of these new sub-portions assembled and assessed accordingly. The iterative process can be ended when an appropriate output is provided, or when a minimum sub-portion size is reached.

According to a further aspect the invention provides A data processor for processing a plurality (n) of received copies of the same original data, each said copy including at least one data portion, the method comprising means for performing maximum ratio combining on equivalent data portions of the received copies to derive at least one further equivalent data portion; means for dividing each of the equivalent data portions of the received data portions and the equivalent further data portion into m sub-portions; assembling combinations of divided sub-portions to provide reconstructed data portions; performing an error rate assessment on said reconstructed data portions; and selecting one of said reconstructed data portions as an output based on the result of said assessment.

The invention also provides a computer program and a computer program product for carrying out any of the methods described herein and/or for embodying any of the apparatus features described herein, and a computer readable medium having stored thereon a program for carrying out any of the methods described herein and/or for embodying any of the apparatus features described herein.

The invention extends to methods, apparatus and/or use substantially as herein described with reference to the accompanying drawings. Any feature in one aspect of the invention may be applied to other aspects of the invention, in any appropriate combination. In particular, features of method aspects may be applied to apparatus aspects, and vice versa. Furthermore, features implemented in hardware may generally be implemented in software, and vice versa. Any reference to software and hardware features herein should be construed accordingly.

BRIEF DESCRIPTION OF THE DRAWINGS

Preferred features of the present invention will now be described, purely by way of example, with reference to the accompanying drawings in which.

DETAILED DESCRIPTION OF PREFERRED EMBODIMENTS

Figure 1:
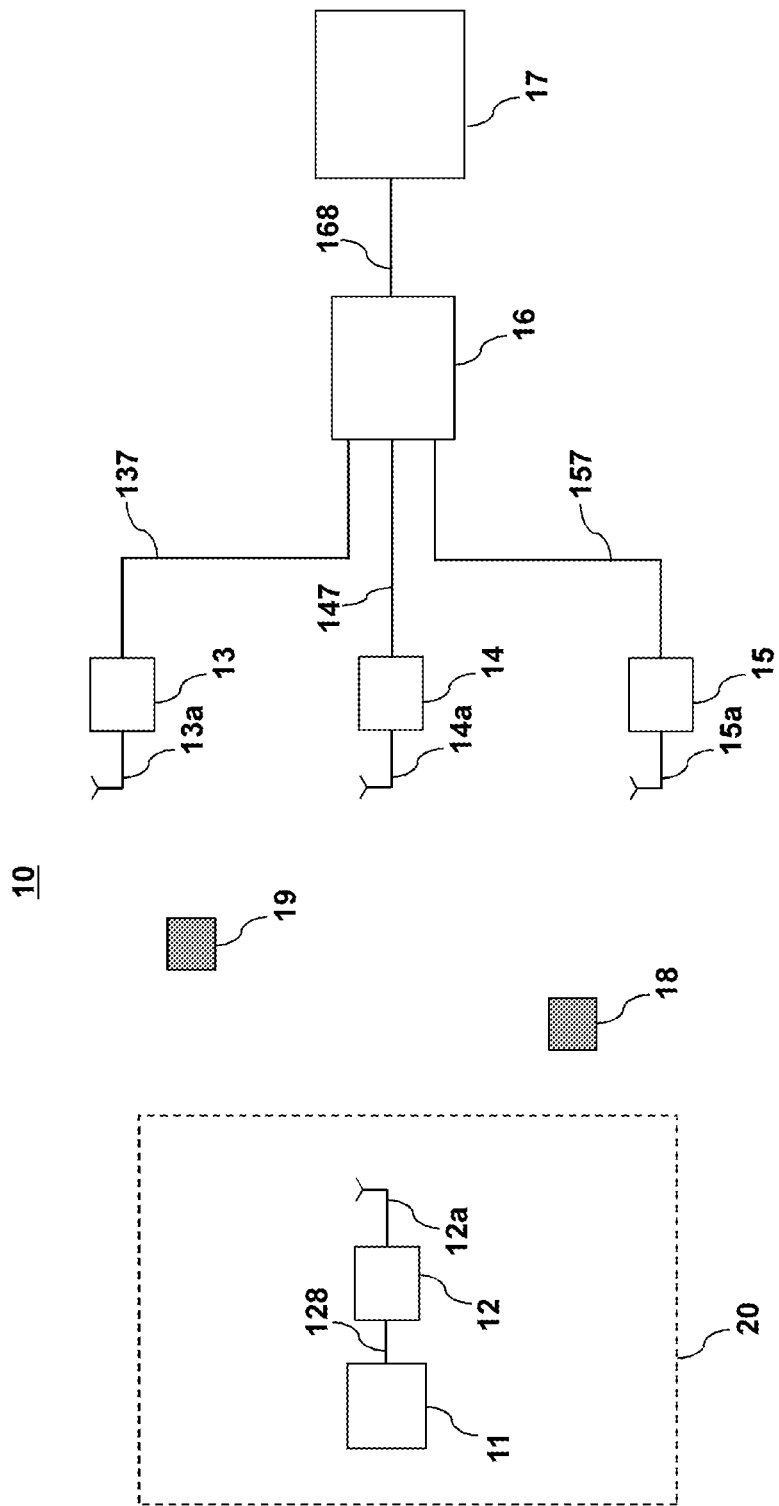
FIG. 1 shows the configuration of the wireless system.

FIG. 1 represents an example configuration of a 60 GHz wireless network system 10.

The emitter node 12 is connected to an HD video or image data source device 11 through a wire interface 128. The source device 11 can be for example an HD digital camera or an HD digital camcorder. The wireless emitter node 12 processes the HD video or image data; in particular it performs a CRC encoding on portions of video or image data, and sends the processed data wirelessly through its antenna 12a. The emitter node 12 can send the processed data from several different positions within the area 20.

The data sent by the emitter node 12 is received by the receiver nodes 13, 14 and 15 respectively through their antenna 13a, 14a and 15a. The receiver nodes 13, 14 and 15 are located in different positions to create spatial diversity. In this embodiment, 3 receiver nodes are used but other configurations could be used also, for example configurations with 2, 4, 5 or 6 receiver nodes could be used.

The grey boxes 18 and 19 represent some obstacles that can be positioned between emitter node 12 and receiver nodes 13, 14 and 15. These obstacles can be physical objects, people, furniture, etc. Depending on the position of the emitter 12 within the area 20 and depending on the position of the obstacles 18 and 19, one or more line of sight communication path between the emitter node 12 and the receiver nodes 13, 14 and 15 can be disturbed or cut. As a result, the receiver nodes 13, 14 and 15 may have different reception quality, i.e. different BER.

The receiver nodes 13, 14 and 15 process the data received from the emitter node 12 and sends the processed data to the system controller 16 respectively through the wire interfaces 137, 147 and 157.

The system controller 16 thus receives 3 copies of the same original data from the receiver nodes 13, 14 and 15. Then these 3 copies are presented at the inputs of the multi-input CRC with maximum ratio module 165 (shown in FIG. 2) located within the system controller 16. The multi-input CRC with maximum ratio module 165 will be described in detail in FIG. 3 and FIG. 4. This module 165 uses a decoding technique employing CRC to generate HD video or image data from the 3 received copies.

Next, the system controller 16 sends the decoded HD video or image data to the sink device 17 through a wire interface 168. The sink device 17 can be an HD video/image display, a Personal Computer (PC) etc.

Figure 2:
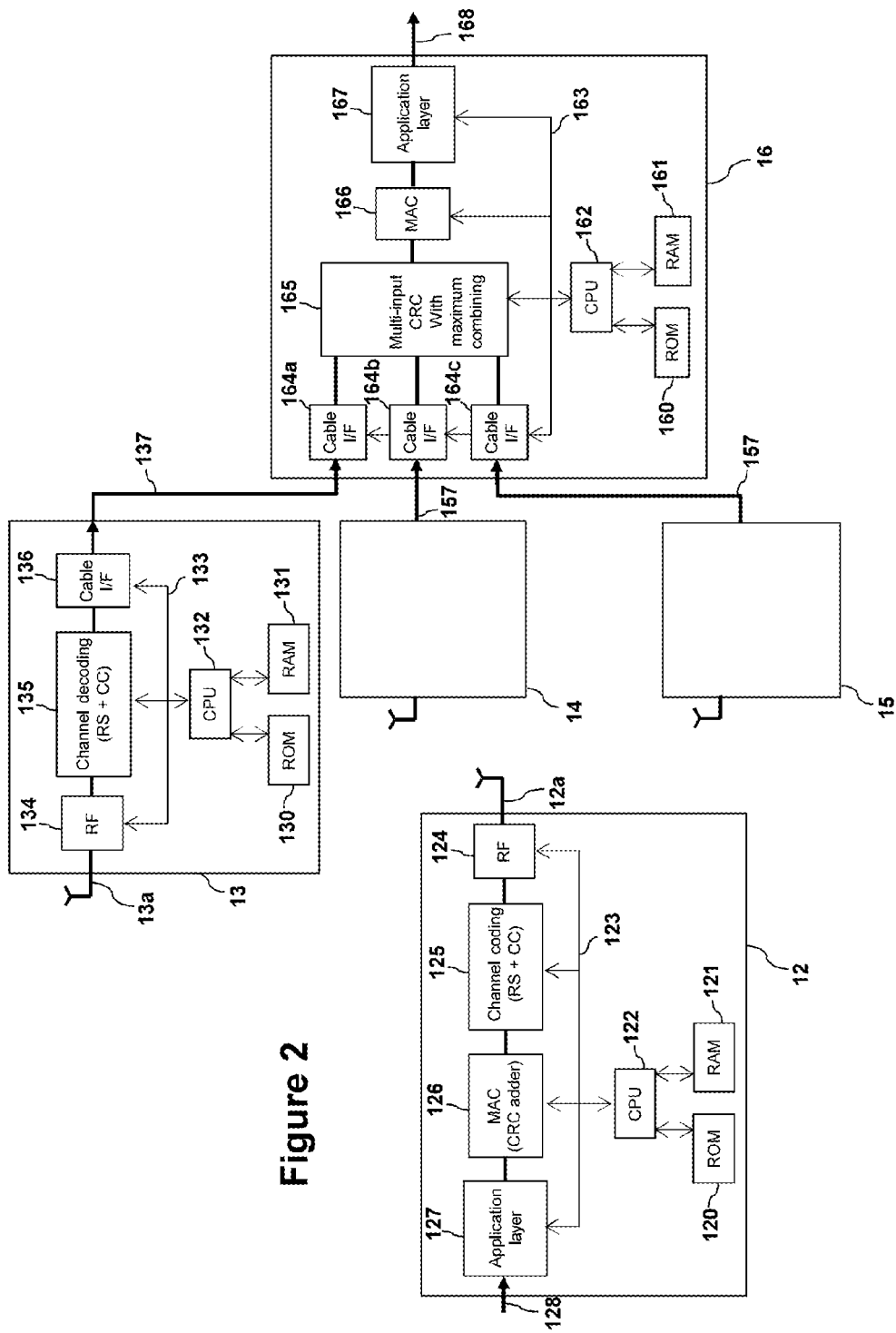
FIG. 2 shows the functional block diagram of each device in the wireless system.

FIG. 2 describes in more detail the function and structure of emitter node 12, the receiver nodes 13, 14 and 15 and the system controller 16.

The emitter node 12 is connected to an HD video or image source device 11 (not shown) through a wire interface 128. The wire interface 128 can be an HDMI interface, a Camera Link interface, etc. The source device 11 (shown in FIG. 1)

is connected to the module 127 of the node 12 via the wire interface 128. The module 127 is the Application layer module of the emitter node 12. The module 127 retrieves the HD video or image content received from source device 11 (not shown) and formats these HD video or image data to be processed by MAC layer module 126. The formatted data are then sent to the MAC layer module 126.

The MAC module 126 receives the formatted data sent by the Application layer 127. The MAC module 126 builds the MAC data packets by adding header data to the received formatted data and by adding CRC encoding on portions of data. For example, each 32 Bytes of data, the MAC module 126 computes and adds a 4 Byte CRC to form an encoded data block. A MAC data packet consists of several encoded data blocks. Then the MAC data packets are sent to the Channel Coding module 125.

The Channel Coding module 125 receives the MAC data packets and performs channel encoding. For example, the module 125 can encode the MAC data packets using a Reed Solomon (216/224) encoder and a convolutive encoder (2/3). The output of Channel Coding module 125 is connected to the RF transceiver module 124.

The RF transceiver 124 receives the MAC data packets after channel encoding by the module 125. Then the RF transceiver 124 builds the radio packets by modulating the received data and by adding a preamble pattern. Then the RF transceiver 124 fulfils the remaining functions needed for the transmission of radio packets on the 60 GHz radio channel through the antenna 12a.

The CPU module 122 of the emitter node 12 is connected to a ROM 120 and a RAM 121. The ROM 120 contains a software program which can be used, when executed by the CPU 122 (using the RAM 121), to implement aspects of the present invention. The RAM 121 is used for the execution by the CPU 122 of the above-mentioned software program and for the processing of the different tasks performed by the CPU 122.

The CPU 122 is connected to the modules 127, 126, 125 and 124 via a bi-directional address/data bus 123. Amongst other things, this connection permits to the CPU 122 to initialize and configure the modules 127, 126, 125 and 124 at system start-up.

Receiver nodes 13, 14 and 15 receive the radio packets sent by the emitter node 12 respectively through their antenna 13a, 14a and 15a. The receiver nodes 13, 14 and 15 have the same functional structure, and as a result only receiver node 13 will be described here.

In the receiver node 13, the RF transceiver 134 provides the function needed for the reception of radio packets on the 60 GHz radio channel through the antenna 13a. After the reception of radio packets, the RF transceiver 134 removes the preamble pattern from the radio packet and demodulates the received data. The demodulated data are then sent to the channel decoding module 135.

The Channel Decoding module 135 receives the demodulated data and performs channel decoding function. For example, the module 135 decodes the demodulated data using a Viterbi decoder (2/3) and a Reed Solomon (216/224) decoder. Then the Channel Decoding module 135 sends the retrieved MAC data packets to the Cable Interface module 136.

The Cable Interface module 136 receives the MAC data packets from the Channel Decoding module 135. The module 136 formats the MAC data packets to transmit them to the system controller 16 via the wire link 137. The wire link 137 is typically a serial wire link able to support data rate up to several Gbps.

The CPU module 132 of the receiver node 13 is connected to a ROM 130 and a RAM 131. The ROM 130 contains a software program which can be used, when executed by the CPU 132 (using the RAM 131), to implement aspects of the present invention. The RAM 131 is used for the execution by the CPU 132 of the above-mentioned software program and for the processing of the different tasks performed by the CPU 132.

The CPU 132 is connected to the modules 136, 135 and 134 via a bi-directional address/data bus 133. Amongst other things, this connection permits to the CPU 132 to initialize and configure the modules 136, 135 and 134 at system start-up.

The system controller 16 receives 3 copies of each formatted MAC data packet from the 3 receiver nodes 13, 14 and 15 respectively via the wire link 137, 147 and 157.

The first copy of formatted MAC data packet is transmitted by the receiver node 13 and received by the system controller 16 through its Cable Interface module 164a. The Cable Interface module 164a processes the received data and sends the first copy of MAC data packet to the module 165. Second and third copies are received by system controller 16 similarly.

Module 165 is the multi-input CRC with maximum ratio combining. The module 165 receives 3 copies (n=3) of each MAC data packet from the 3 Cable Interfaces 164a, 164b and 164c. As explained previously, a MAC data packet consists of several encoded data blocks. For each copy of an encoded data block, the module 165 performs a division into m sub-blocks. Then the module 165 performs combinations of the various sub-blocks to build $n^m$ combined data blocks. Next, the module 165 performs in parallel a CRC check on each combined data blocks. Finally, the module 165 selects the first combined data block that satisfied the CRC check and provides it to the MAC module 166.

The MAC module 166 receives the combined data blocks outputted by the module 165 and re-constructs each MAC data packet.

Then the MAC module 166 retrieves the HD video or image data by removing the header information attached to the MAC data packets. Next, the MAC module 166 provides the HD video or image data to the Application layer module 167. The Application layer 167 receives the HD video or image data from the MAC layer 166 and re-builds the HD video or image content. The HD video or image content is then sent to the sink device 17 (not shown) through the wire interface 168. The wire interface 168 can be an HDMI interface, a Camera Link interface or else.

The CPU module 162 of the system controller 16 is connected to a ROM 160 and a RAM 161. The ROM 160 contains a software program which can be used, when executed by the CPU 162 (using the RAM 161), to implement aspects of the present invention. The RAM 161 is used for the execution by the CPU 162 of the above-mentioned software program and for the processing of the different tasks performed by the CPU 162. The CPU 162 is connected to the modules 167, 166, 165, 164a, 164b, 164c via a bi-directional address/data bus 163.

Amongst other things, this connection permits to the CPU 162 to initialize and configure the modules 167, 166, 165, 164a, 164b, 164c at system start-up.

Figure 3:
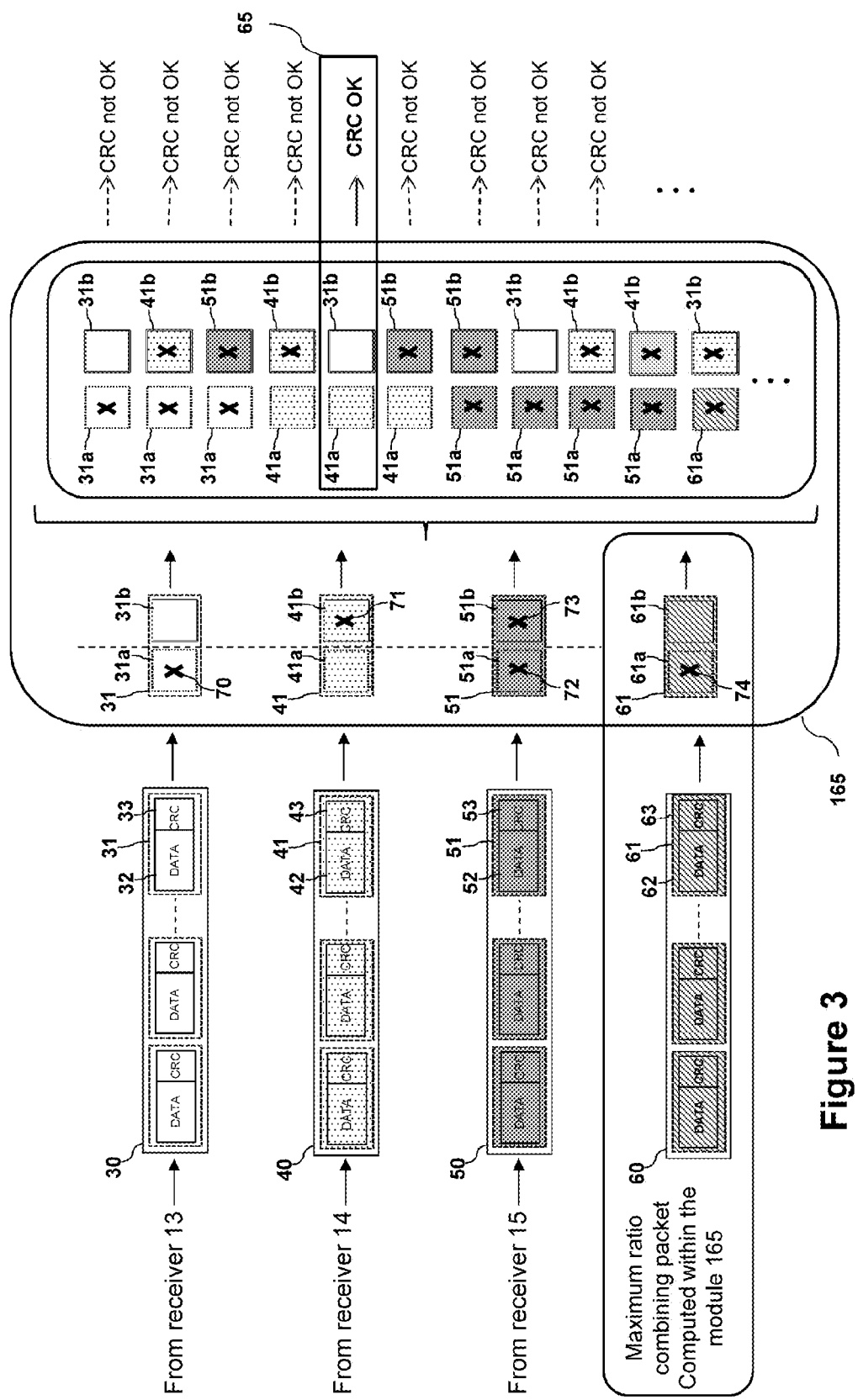
FIG. 3 describes the functional principle of multi-input CRC with maximum ratio combining.

FIG. 3 describes the functional principle of multi-input CRC with maximum ratio combining, as performed by module 165.

The principle of multi-input CRC with maximum ratio combining 165 is described here by considering an example of 3 receivers (n=3) and a division of copies of an encoded data block into 2 sub-blocks (m=2). These values, n=3 and m=2, are not limitative and other values can be used.

The multi-input CRC with maximum ratio combining module 165 receives the 3 copies 30, 40 and 50 of a MAC data packet respectively from the 3 receiver nodes 13, 14 and 15.

The copy 30 of the MAC data packet consists of several encoded data blocks identical in format to the encoded data block 31. The encoded data block 31 is made of a data part 32 and a CRC part 33. For example the size of the data part 32 is 32 Bytes and the size of CRC part 33 is 4 Bytes. The copy 40 and the copy 50 of the MAC data packet respectively, also consist of several encoded data blocks having an equivalently similar format.

The 3 copies of each encoded data block within a MAC data packet are inputted and processed one by one within the multi-input CRC with maximum ratio combining module 165.

The module 165 computes, starting from the three received copies, an additional copy 60 by applying a bit to bit majority vote rule.

The majority decision or majority vote scheme is known in the art. In the majority vote scheme, the output of the decoder is equal to the equivalent or corresponding data that are the most represented (ie the highest frequency) at the input of the decoder. The majority vote technique is typically used only if the considered radio communication paths have similar BER. Indeed, if one radio path contains very few errors comparing to the others radio paths, another technique should normally be considered.

The module 165 compares the first bit of the packet 30 with the equivalent first bits of the packets 40 and 50. The most representative, or most common value, of this first bit is selected and considered as equal to the first bit of the packet 60. The same rule is applied for all the bits of the copies 30, 40 and 50.

After computing the additional copy, the module 165 performs a division of each copy (including the additional copy 60) of an encoded data block into 2 sub-blocks. The copy 31 of an encoded data block is divided into 2 sub-blocks 31a and 31b of equal size. The copy 41 of an encoded data block is divided into 2 sub-blocks 41a and 41b of equal size. The copy 51 of an encoded data block is divided into 2 sub-blocks 51a and 51b of equal size. And the copy 60 is divided into 2 sub-block 61a and 61b of equal size.

A cross within a sub-block of a copy of an encoded data block represents an error introduced during the wireless transmission between the emitter node 12 (shown in FIG. 1) and the receiver node 13 (shown in FIG. 1). As a result, the copy 31 cannot be decoded successfully as received from receiver node 13. For example, the cross 71 within the sub-block 41b of copy 41 of an encoded data block represents an error introduced during the wireless transmission between the emitter node 12 (shown in FIG. 1) and the receiver node 14 (shown in FIG. 1). As a result, the copy 41 cannot be decoded successfully as received from receiver node 14.

The module 165 performs combinations of the various sub-blocks to build $(n+1)^m=4^2=16$ combined data blocks. The first combined data block is built by combining sub-blocks 31a and 31b, the second combined data block is built by combining sub-blocks 31a and 41b, the third combined data block is built by combining sub-blocks 31a and 51b . . . etc.

Module 165 then performs in parallel a CRC check on each of the 16 combined data blocks.

Finally, the module 165 selects a combined data block that satisfies the CRC check and provides it to the MAC module 166 (shown in FIG. 2). In 65, the combined data block that satisfied the CRC check is indicated. This combined data block has been built by combining the error-free sub-blocks 41a and 31b.

Figure 4:
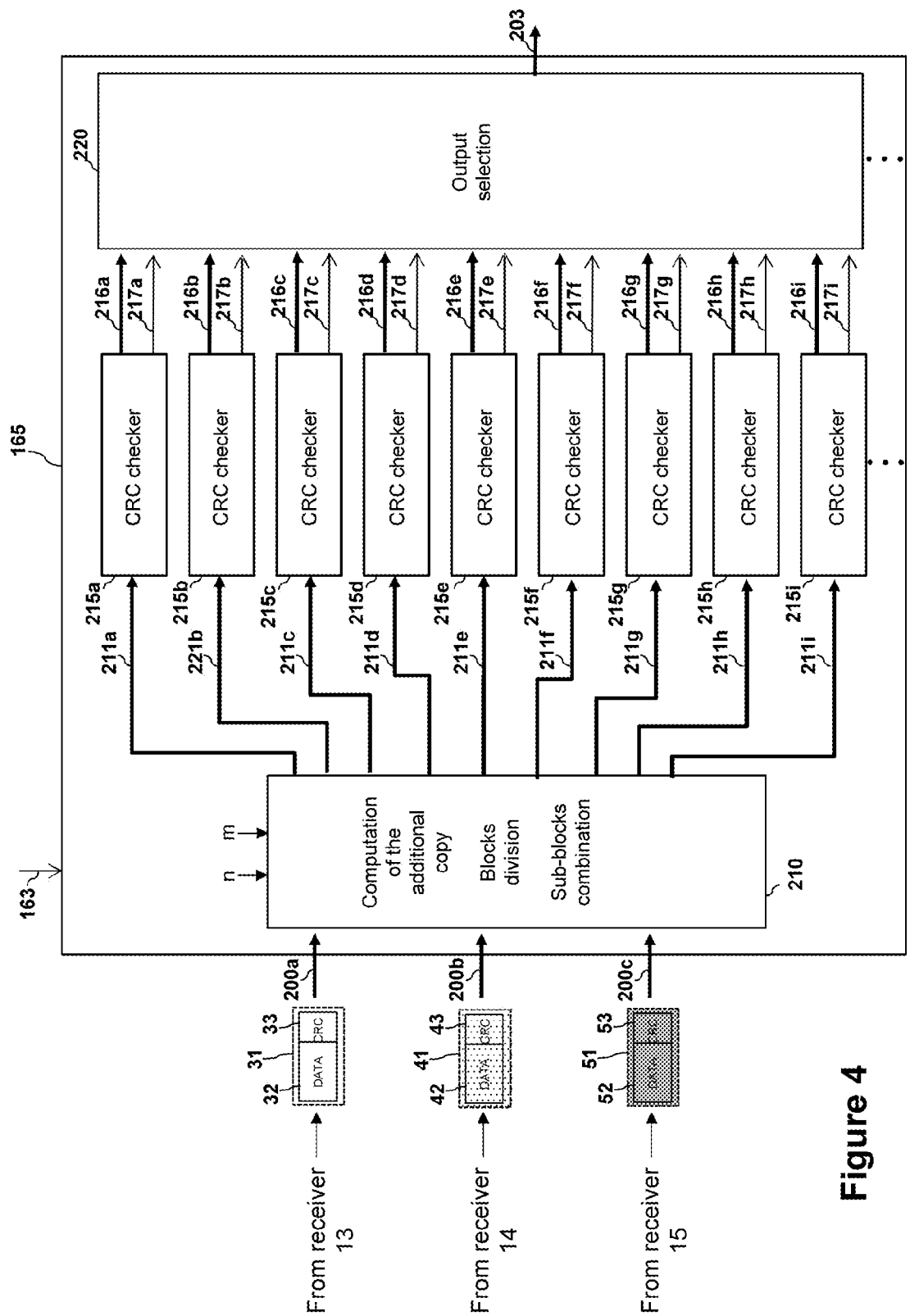
FIG. 4 shows an example hardware architecture of multi-input CRC with maximum ratio combining.

FIG. 4 represents a possible hardware architecture for the multi-input CRC with maximum ratio combining module 165.

The 3 copies 31, 41 and 51 of an encoded data block are inputted to the sub-module 210 respectively through the interfaces 200a, 200b and 200c. For example, the interfaces 200a, 200b and 200c are 32 bits width parallel interfaces.

At system start-up or after a system reset, the CPU 162 (shown in FIG. 2) initializes and configures, through the bus 163, the sub-module 210 by providing the values of n (number of receivers) and m (division factor) to be used. The sub-module 210 reads in parallel the data of the 3 copies 31, 41 and 51 of an encoded data block. For example, in case of copies 31, 41 and 51 of 36 Bytes size and of interfaces 200a, 200b and 200c of 32 bits width, the sub-module 210 takes 9 clock cycles to read all the data of the copies.

The sub-module 210 controls the division of the 3 copies of an encoded data block into 2 sub-blocks and also controls the combination of the various sub-blocks to build $(n+1)^m=4^2=16$ combined data blocks. The sub-module 210 provides the data of the 16 combined data blocks to the 16 CRC checkers 215a, 215b, 215c, 215d, . . . etc respectively through the interfaces 211a, 211b, 211c, 211d, . . . etc. For example, the interfaces 211a, 211b, 211c, 211d . . . are 32 bits width parallel interfaces. Each CRC checker 215a, 215b, 215c, 215d, . . . etc computes in parallel a new CRC on the data of each combined data block and checks the validity of the CRC embedded within each combined data block.

The sub-module 220 is the Output selection module. The sub-module 220 receives in parallel the 16 combined data blocks from the 16 CRC checkers and selects a combined data block that satisfied the CRC check. The selected combined data block is then sent to the MAC module 166 (see FIG. 2) through the interface 203. For example, the interface 203 is a 32 bits width parallel interface.

In the hardware architecture described in FIG. 4, the division and the combination within sub-module 210 and the CRC check within CRC checkers 215a, 215b, 215c, 215d, . . . etc are performed continuously while the data of the 3 copies 31, 41 and 51 are read by the sub-module 210. Thus the CRC check within each CRC checker can start simultaneously for all the combined data blocks before data of the 3 copies are completely read by sub-module 210. This hardware architecture has the advantage to reduce the latency.

Figure 5:
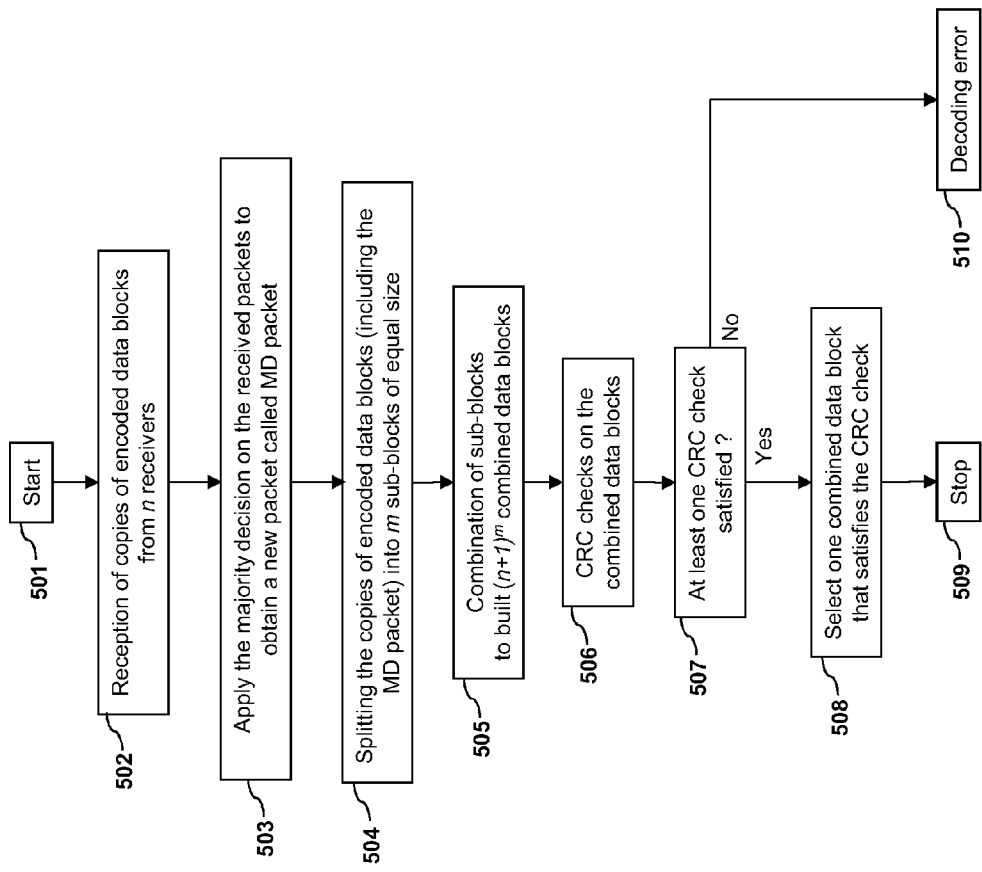
FIG. 5 represents the steps of the algorithm corresponding to a preferred embodiment of the present invention.

FIG. 5 represents the steps of the algorithm corresponding to the preferred embodiment of the present invention. The algorithm of this preferred embodiment employs a fixed division factor (m) and by sub-blocks of equal size.

In step 501 the algorithm starts. In step 502 the multi-input CRC with maximum ratio combining module 165 receives the n copies of encoded data block from the n receiver nodes. In the step 503, the multi-input CRC with maximum ratio combining module computes the additional packet by applying the majority decision rule.

Below is an example of the majority decision rule applied on three received packets in order to generate one additional packet: Let us assume that the original data is noted x, the three received copies are noted x1,x2,x3 and the additional copy obtained with the majority decision rule is x_md:

x=[1 0 0 1 0 1 1]
x1=[1 1 0 1 0 1 1]
x2=[1 0 0 1 0 1 0]
x3=[0 0 0 1 0 1 0]
x_md=[1 0 0 1 0 1 0]
nb: errors are shown in bold.

In the step 504 the multi-input CRC with maximum ratio combining module 165 splits each copy of encoded data block into m sub-blocks of equal size. Then, in step 505 the multi-input CRC with maximum ratio combining module 165 combines the various sub-blocks to build (n+1)$^m$ combined data blocks. In the step 506, the multi-input CRC with maximum ratio combining module 165 checks the CRC of each combined data blocks.

In the step 507, the multi-input CRC with maximum ratio combining module 165 verifies that at least one CRC check is satisfied on one combined data block. If the result is "No", the algorithm goes to the step 510. The step 510 corresponds to an error case. In this case, the corresponding encoded data block sent by the emitter node 12 cannot be recovered by the system controller 16.

If the result is "Yes", the algorithm goes to the step 508. In the step 508, the multi-input CRC with maximum ratio combining 165 selects one combined data block that satisfied the CRC check. The selected combined data block is then provided to the upper layer of the system controller 16, i.e. to the MAC layer 166.

In the step 509 the algorithm is stopped.

Figure 6:
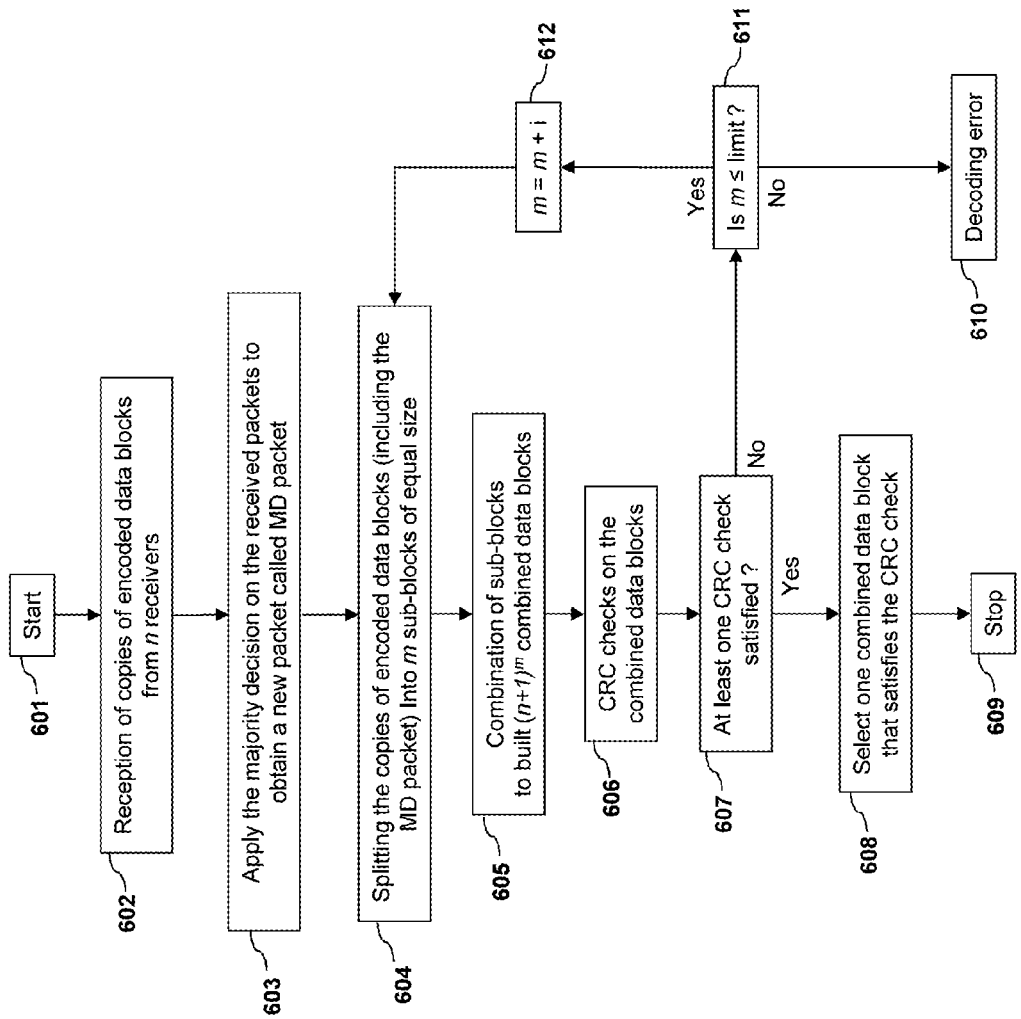
FIG. 6 represents the steps of the algorithm corresponding to a first variant of the present invention.

FIG. 6 represents the steps of the algorithm corresponding to a first variant of the present invention. The algorithm of this first variant employs an iterative division factor (m) and sub-blocks of equal size.

In this algorithm corresponding to a first variant of the present invention, the two new steps 611 and 612 are added. In this algorithm, the value of m and thus the number of sub-blocks per encoded data block is progressively increased (step 612) as long as the CRC check is not satisfied (step 607) or when all iterations values of m have been tested (step 611).

In step 601 the algorithm starts. In step 602 the multi-input CRC with maximum ratio combining module 165 receives the n copies of encoded data block from the n receiver nodes. In step 603 the multi-input CRC with maximum ratio combining module computes the additional packet by applying the majority decision rule In the step 604 the multi-input CRC with maximum ratio combining module 165 splits each copy of encoded data block into m sub-blocks of equal size. Then, in step 605 the multi-input CRC with maximum ratio combining module 165 combines the various sub-blocks to build (n+1)$^m$ combined data blocks. In the step 606, the multi-input CRC with maximum ratio combining module 165 checks the CRC of each combined data blocks. In the step 607, the multi-input CRC with maximum ratio combining module 165 verifies that at least one CRC check is satisfied on one combined data block.

If the result of the step 607 is "No", the algorithm goes to the step 611. In the step 611, the multi-input CRC with maximum ratio combining module 165 checks if the value of m is below or equal to a limit.

If the result of the step 611 is "No", it means that all iteration values of m have been tested without any success. In this case the algorithm goes to the step 610. The step 610 corresponds to an error case. In this case, the corresponding encoded data block sent by the emitter node 12 cannot be recovered by the system controller 16.

If the result of the step 611 is "Yes", the algorithm goes to the step 612. In the step 612 the value of m is increased by an incrementing value I, typically 1. Then, the algorithm loops back to the step 604.

If the result of the step 607 is "Yes", the algorithm goes to the step 608. In the step 608, the multi-input CRC with maximum ratio combining module 165 selects a combined data block that satisfied the CRC check. The selected combined data block is then provided to the upper layer of the system controller 16, i.e. to the MAC layer 166. In the step 609 the algorithm is stopped.

Figure 7:
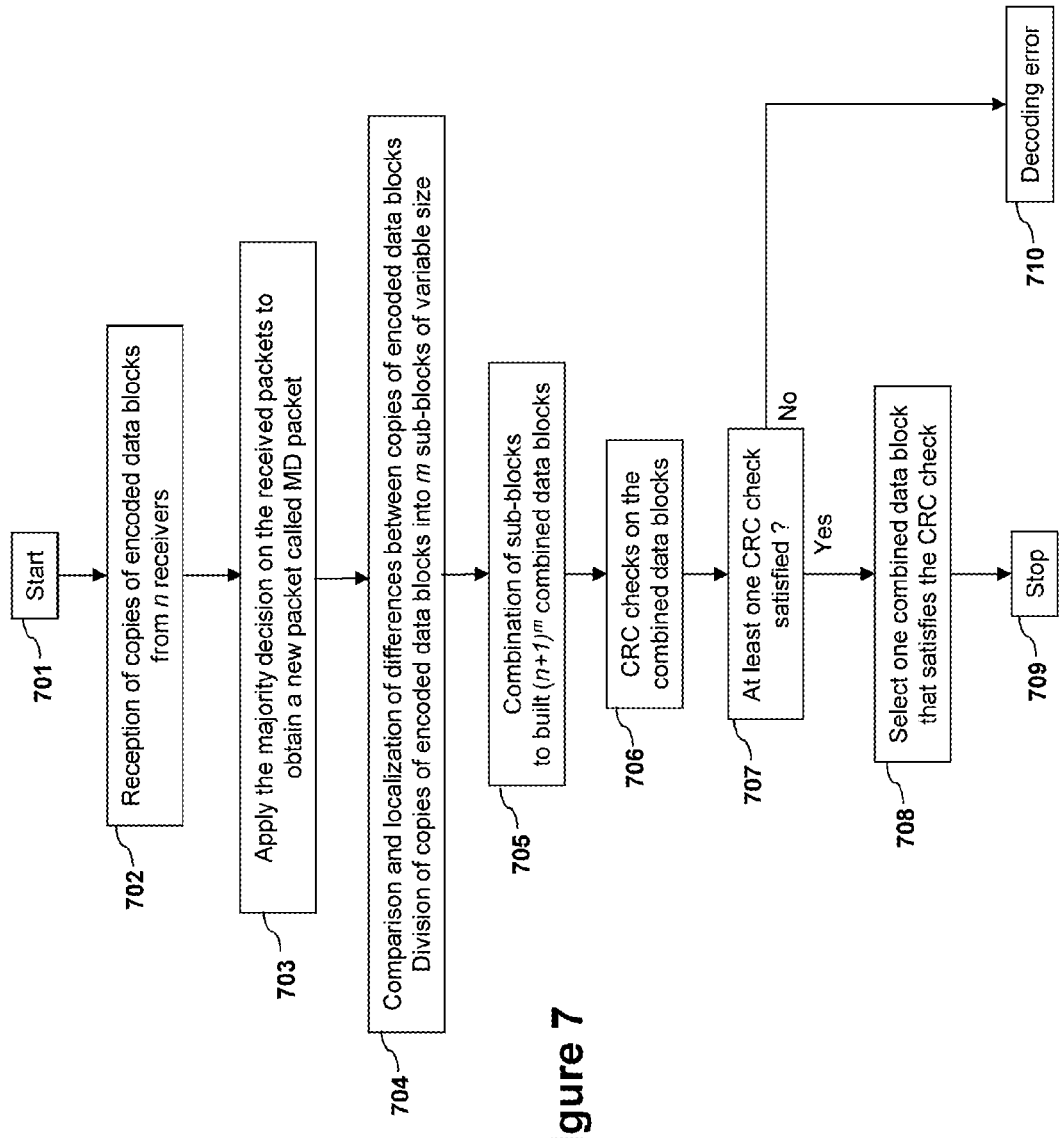
FIG. 7 represents the steps of the algorithm corresponding to a an alternative variant of the present invention.

FIG. 7 represents the steps of the algorithm corresponding to a second variant of the present invention. The algorithm of this second variant employs a fixed division factor (m) and sub-blocks of variable size. In this variation, the n copies of encoded data block are compared to localize the differences, i.e. to localize the errors (step 703).

In step 701 the algorithm starts. In step 702 the multi-input CRC with maximum ratio combining module 165 receives the n copies of encoded data block from the n receiver nodes. In step 703 the multi-input CRC with maximum ratio combining module computes the additional packet by applying the majority decision rule In the step 704 the multi-input CRC with maximum ratio combining module 165 compares the n copies of encoded data block and localizes the differences. Then the multi-input CRC with maximum ratio combining module 165 splits each copy of encoded data block into m sub-blocks of variable size. The variable size of the sub-blocks, and the point(s) of division to form such sub-blocks can be based upon the location of the differences.

The following example explains a simple method to localize the bit differences between two copies:

Let assume that the original data is noted x and the two received copies are noted x1,x2:
x=[1 0 0 1 0 1 1]
x1=[1 1 0 1 0 1 1]
x2=[1 0 0 1 0 1 0]

One applies a bit to bit comparison between x1 and x2. If the x1 bit is equal to the x2 bit then one write 0 else one write 1 in a new vector noted x_Id. x_Id is equal to: x_Id=[0 1 0 0 0 0 1]

The differences are then in the second position and in the last position.

Then, in step 705 the multi-input CRC with maximum ratio combining module 165 combines the various sub-blocks to build (n+1)$^m$ combined data blocks. In the step 706, the multi-input CRC with maximum ratio combining module 165 checks the CRC of each combined data blocks. In the step 707, the multi-input CRC with maximum ratio combining module 165 verifies that at least one CRC check is satisfied on one combined data block.

If the result is "No", the algorithm goes to the step 708. The step 710 corresponds to an error case. In this case, the corresponding encoded data block sent by the emitter node 12 cannot be recovered by the system controller 16.

If the result is "Yes", the algorithm goes to the step 708. In the step 708, the multi-input CRC with maximum ratio combining module 165 selects one combined data block that satisfied the CRC check. The selected combined data block is then provided to the upper layer of the system controller 16, i.e. to the MAC layer 166.

In the step 709 the algorithm is stopped.

Figure 8:
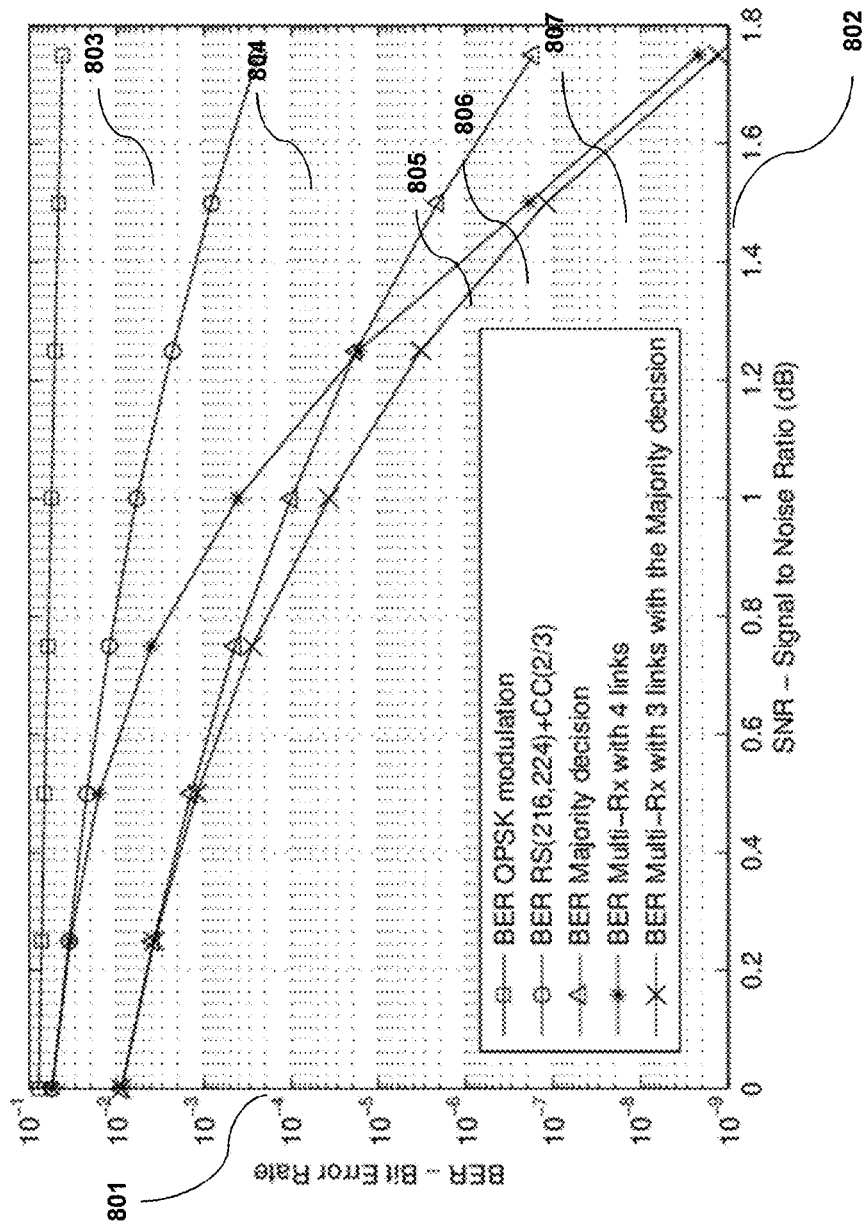
FIG. 8 is obtained by simulation and compares the curves BER=f(SNR) for the multi-input CRC with maximum ratio combining and other prior art decoding techniques.

FIG. 8 is obtained by simulation and compares the curves BER=f(SNR) for the multi-input CRC with maximum ratio combining module 165 and other prior art decoding techniques. In this simulation result graph, the multi-input CRC with maximum ratio combining module 165 is configured for 3 receivers nodes (n=3) and a division of copies of encoded data block into 2 sub-blocks (m=2) of equal size.

The y-axis 801 indicates the Bit Error Rate, the x-axis 802 indicates the Signal to Noise Ratio in dB.

The curve 803 is the simulation result curve corresponds to a QPSK modulation. The curve 804 is the simulation result curve obtained for a concatenation of a Reed Solomon code (216,224) and a Convolutive Code (1/2) with the QPSk modulation. The curve 805 is the simulation result curve obtained for a Majority decision technique for 3 receivers.

Curve 806 is the simulation result curve obtained for the multi-input CRC without the maximum ratio combining packet with n=4 and m=2 (i.e. $4^2$=16 CRC checkers).

Curve 807 is the simulation result curve obtained for the multi-input CRC with the maximum ratio combining packet (ie according to an embodiment of the present invention) with n=3 and m=2 (i.e. $(3+1)^2$=16 CRC checkers).

The simulation result represented in the FIG. 8 shows that the multi-input CRC with the maximum ratio combining gives better BER performances than other prior art decoding techniques. Moreover, with ones less receiver, the present invention gives a lower BER than the multi-input CRC without the maximum ratio combining for the same complexity (i.e. 16 CRC checkers).

It will be understood that the present invention has been described above purely by way of example, and modification of detail can be made within the scope of the invention.

Each feature disclosed in the description, and (where appropriate) the claims and drawings may be provided independently or in any appropriate combination.

The invention claimed is:

1. A data processing method for processing a plurality (n) of received copies of the same original data, each said copy including at least one data portion, the method comprising:
    performing bit to bit majority vote rule on equivalent data portions of the received copies to derive a single further equivalent data portion;
    dividing each of the equivalent data portions of the received data portions and the equivalent further data portion into m sub-portions, wherein the m sub-portions are of equal size;
    assembling combinations of divided sub-portions to provide reconstructed data portions;
    performing an error rate assessment on said reconstructed data portions, and, in case the error rate assessment is not satisfied, progressively increasing the number of sub-portions per data portion by increasing the value of m used in the driving as long as the error rate assessment is not satisfied; and
    selecting one of said reconstructed data portions as an output based on the result of said assessment in the case the error rate assessment is satisfied.

2. The method according to claim 1, comprising selecting one reconstructed copy having a lower or equal symbol error rate than the symbol error rate of the other copies.

3. The method according to claim 1, wherein the selecting step comprises decoding the reconstructed copies by means of an error detection code (CRC), and selecting the reconstructed copy having no errors, if any.

4. A data processor for processing a plurality (n) of received copies of the same original data, each said copy including at least one data portion, comprising:
    a combining unit arranged to perform bit to bit majority vote rule on equivalent data portions of the received copies to derive a single further equivalent data portion, wherein the m sub-portions are of equal size;
    a dividing unit arranged to divide each of the equivalent data portions of the received data portions and the equivalent further data portion into m sub-portions;
    an assembly unit arranged to assemble combinations of divided sub-portions to provide reconstructed data portions;
    a rate assessment unit arranged to perform an error rate assessment on said reconstructed data portions and wherein, in case the error rate assessment is not satisfied, the driving unit is arranged to progressively increasing the number of sub-portions per data portion by increasing the value of m as long as the error rate assessment is not satisfied; and
    a selection unit arranged to select one of said reconstructed data portions as an output based on the result of said assessment in case the error rate assessment is satisfied.

5. A non-transitory computer readable medium storing a computer program, which when executed on a computer, causes that computer to perform a method:
    performing bit to bit majority vote rule on equivalent data portions of the received copies to derive a single further equivalent data portion;
    dividing each of the equivalent data portions of the received data portions and the equivalent further data portion into m sub-portions, wherein the m sub-portions are of equal size;
    assembling combinations of divided sub-portions to provide reconstructed data portions;
    performing an error rate assessment on said reconstructed data portions and, in case the error rate assessment is not satisfied, progressively increasing the number of sub-portions per data portion by increasing the value of m used in the driving as long as the error rate assessment is not satisfied; and
    selecting one of said reconstructed data portions as an output based on the result of said assessment in case the error rate assessment is satisfied.

6. The method according to claim 1, wherein the method further comprises:
    dividing each of the equivalent data portions of the received data portions and the equivalent further data portion into m sub-portions such that m(n+1) sub-portions of equal size are obtained; and
    assembling combinations of the obtained m(n+1) sub-portions to provide $(n+1)^m$ reconstructed data portions blocks.

* * * * *